United States Patent
Miyake et al.

(10) Patent No.: US 6,449,836 B1
(45) Date of Patent: Sep. 17, 2002

(54) METHOD FOR INTERCONNECTING PRINTED CIRCUIT BOARDS AND INTERCONNECTION STRUCTURE

(75) Inventors: Toshihiro Miyake, Inuyama; Katsuaki Kojima, Nagoya; Hiroyasu Iwama, Anjo; Makoto Totani, Kariya; Yoshitaro Yazaki, Anjo; Takehito Teramae, Chiryu; Tomohiro Yokochi, Obu; Kenzo Hirano, Nagoya; Tomoyuki Nanami, Kariya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/626,243

(22) Filed: Jul. 26, 2000

(30) Foreign Application Priority Data

| Jul. 30, 1999 | (JP) | 11-218014 |
| Nov. 30, 1999 | (JP) | 11-340601 |
| May 31, 2000 | (JP) | 2000-161822 |
| Jun. 22, 2000 | (JP) | 2000-188278 |

(51) Int. Cl.$^7$ ............... H05K 3/36
(52) U.S. Cl. ............ 29/830; 29/840; 29/843; 174/263; 228/180.1; 228/179.1
(58) Field of Search ............ 29/830, 840, 843, 29/179.1; 174/264, 263; 228/180.1, 177; 219/605, 616, 633; 439/67, 493, 74; 156/273.3, 275.5

(56) References Cited

U.S. PATENT DOCUMENTS

| 4,164,071 A | * | 8/1979 | Kruzick | 29/625 |
| 4,679,122 A | * | 7/1987 | Belke, Jr. et al. | 361/414 |
| 4,735,847 A | * | 4/1988 | Fujiwara et al. | 428/209 |
| 5,084,961 A | * | 2/1992 | Yoshikawa | 29/840 |
| 5,221,417 A | * | 6/1993 | Basavanhally | 156/629 |
| 5,669,548 A | | 9/1997 | Miyake et al. | |
| 5,799,392 A | * | 9/1998 | Mishiro | 29/830 |
| 5,935,475 A | * | 8/1999 | Scoles et al. | 219/633 |
| 6,143,116 A | * | 11/2000 | Hayashi et al. | 156/233 |
| 6,218,030 B1 | * | 4/2001 | Miyake et al. | 428/618 |
| 6,226,862 B1 | * | 5/2001 | Neuman | 29/830 |
| 2002/0014518 A1 | * | 2/2002 | Totani et al. | 228/180.1 |

FOREIGN PATENT DOCUMENTS

| JP | 9-8453 | 1/1997 |
| JP | 9-320662 | 12/1997 |

OTHER PUBLICATIONS

Numakura, *Introductory High Density Flexible Board*, Nikkan Kogyo Co., Ltd., 1998, pp. 99–103.

* cited by examiner

Primary Examiner—Peter Vo
Assistant Examiner—Minh Trinh
(74) Attorney, Agent, or Firm—Law Offices of David G. Posz

(57) ABSTRACT

In interconnecting printed circuit boards: preparing a first and second printed circuit board is accomplished with the first having an insulating substrate of thermoplastic resin and a conductive pattern with a land, while the second has a conductive pattern with a land; overlapping the land of the first with the land of the second is done to form an interconnection portion; and heating the interconnection portion at a temperature approximately higher than a glass transition temperature of the thermoplastic resin while applying pressure to the interconnection portion to create an electrical interconnection sealed with a part of the thermoplastic resin constituting the insulating substrate of the first board is accomplished. The insulating substrate of the first board is overlapped with an insulating substrate of the second printed board to interpose a film, the film including material to reduce a modulus of elasticity of the insulating substrate of the first board.

29 Claims, 11 Drawing Sheets

METHOD FOR INTERCONNECTING PRINTED CIRCUIT BOARDS AND INTERCONNECTION STRUCTURE

CROSS REFERENCE TO RELATED APPLICATIONS

This application is based upon and claims the benefit of Japanese Patent Applications No. 11-218014 filed on Jul. 30, 1999, No. 11-340601 filed on Nov. 30, 1999, No. 2000-161822 filed on May 31, 2000, and No. 2000-188278 filed on Jun. 22, 2000, the contents of which are incorporated herein by reference.

BACKGROUND OF THE INVENTION

1. Field of the Invention

This invention relates to a method for interconnecting printed circuit boards and an interconnection structure.

2. Description of the Related Art

JP-A-9-8453 discloses an interconnection structure for printed circuit boards, using an anisotropic conductive resin material. Referring to FIG. 18, this structure has an anisotropic conductive thermoplastic resin 52 being placed between a conductive pattern surface of a first printed circuit board 50 and a conductive pattern surface of a second printed circuit board 51, which is fused by applying pressure and ultrasonic waves. In this manner, a distance between lands 50a and 50b is reduced to establish an electric interconnection therebetween.

"Introductory High density Flexible Board (in Japanese)" (by Kenji Numakura, published by Nikkan Kogyo Co., Ltd.) discloses at page 100 a method for interconnecting a hard printed board and a flexible board. In accordance with this method of interconnection, as shown in FIG. 19, a land 60a of a conductive pattern on the hard printed board 60 is interconnected with a land 61a of a conductive pattern on the flexible board 61 by using a solder 62. Furthermore, the flexible board 61 is adhered to the hard printed board 60 by using an adhesive 63.

However, in the interconnection structure as shown in FIG. 18, an anisotropic conductive resin film must be mounted on the surface of the printed circuit boards 50 and 51 by printing or the like. This requires an additional process step to obtain the interconnection structure, and leads to an increase in the production cost.

Furthermore, the printed circuit boards 50 and 51 are interconnected with their surfaces being faced each other while incorporating the anisotropic conductive resin material 52 therebetween. Accordingly, the resulting product suffers poor reliability because voids tend to be generated in the connecting interface between the resin material 52 and each of the printed circuit boards 50 and 51.

In the interconnection structure shown in FIG. 19, it is necessary to cover the edge portion of the flexible board 61 with a protective insulating film after interconnecting the flexible board 61 in order to assure the insulation reliability of the interconnected portion. Thus, in this case again, the production step is increased.

SUMMARY OF THE INVENTION

The present invention has been accomplished in view of the aforementioned problems. Accordingly, an object of the present invention is to provide a method for interconnecting printed circuit boards and an interconnection structure, which is improved in the reliability of the interconnection and capable of reducing the production cost.

According to the present invention, a land of a first printed circuit board is overlapped with a land of a second printed circuit board to form an interconnection portion. The first printed circuit board has an insulating substrate made of a thermoplastic resin. Then, the interconnection portion is heated at a temperature approximately higher than a glass transition temperature of the thermoplastic resin while applying a pressure to the interconnection portion. Accordingly, the land of the first printed circuit board is electrically interconnected with the land of the second printed circuit board. Simultaneously, the interconnection portion is sealed with a part of the thermoplastic resin.

Thus, the interconnection portion is sealed with the resin constituting the substrate of the first printed circuit board without using an anisotropic conductive film or the like, resulting in reduced production cost. Since the thermoplastic resin is softened and deformed to seal the interconnection portion while expelling air, voids are less likely formed at the interconnection portion. As a result, the interconnection structure has high reliability.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS (First Embodiment)

A first embodiment of the present invention is described below with reference to the drawings.

Figure 1:
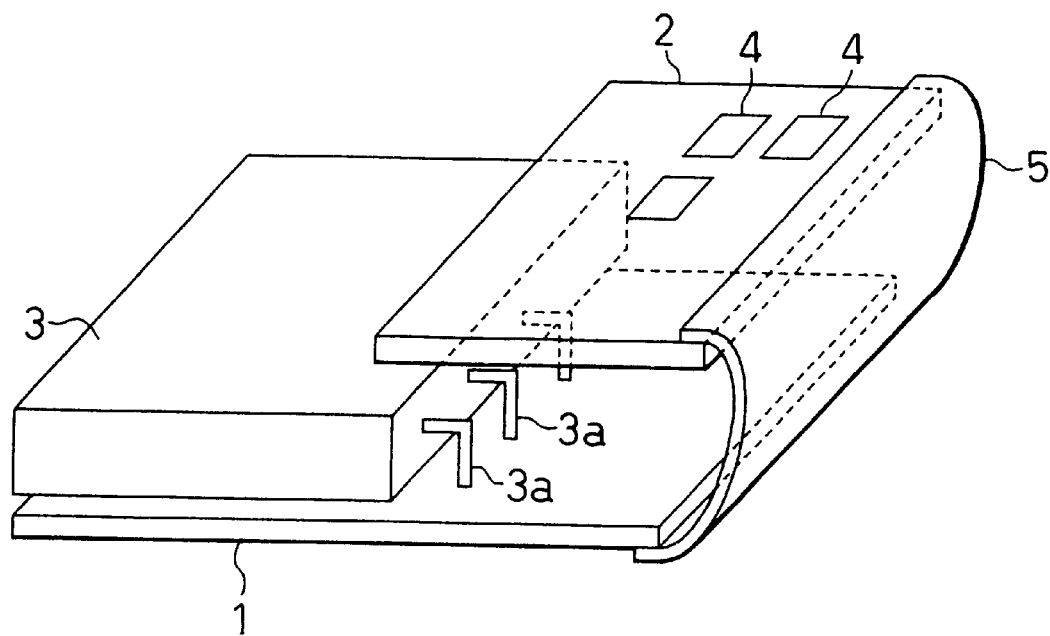
FIG. 1 is a perspective view showing a part of an electronic equipment in embodiments according to the present invention.

FIG. 1 shows a part of an electronic equipment in accordance with the embodiment of the present invention. A rigid printed circuit board 1 and a rigid printed circuit board 2 are supported inside the electronic equipment. Various types of electronic components are mounted on the rigid printed circuit board 1, and FIG. 1 shows a state in which an IC 3 of a DIP package is insertion mounted by using a pin 3a. Similarly, various types of electronic components 4 are mounted on the rigid printed circuit board 2. Each of the rigid printed circuit boards 1 and 2 is constructed by an insulating substrate 10 made of glass cloth-based epoxy resin.

A flexible printed circuit board 5 is electrically interconnected with the rigid printed circuit board 1 and the rigid printed circuit board 2, which are placed on the upper and the lower sides and horizontally with each other. More specifically, with reference to FIG. 1, the flexible printed circuit board 5 is connected to the right side of the rigid printed circuit board 1 and to the right side of the rigid printed circuit board 2. Polyether imide (PEI) is used for a base film 12, i.e., an insulating substrate of the flexible printed circuit board 5. Polyether imide (PEI) is thermoplastic resin which softens at a temperature equal to or higher than a temperature of glass transition, and resists to a temperature not lower than the temperature of fusion of solder.

Figure 2A:
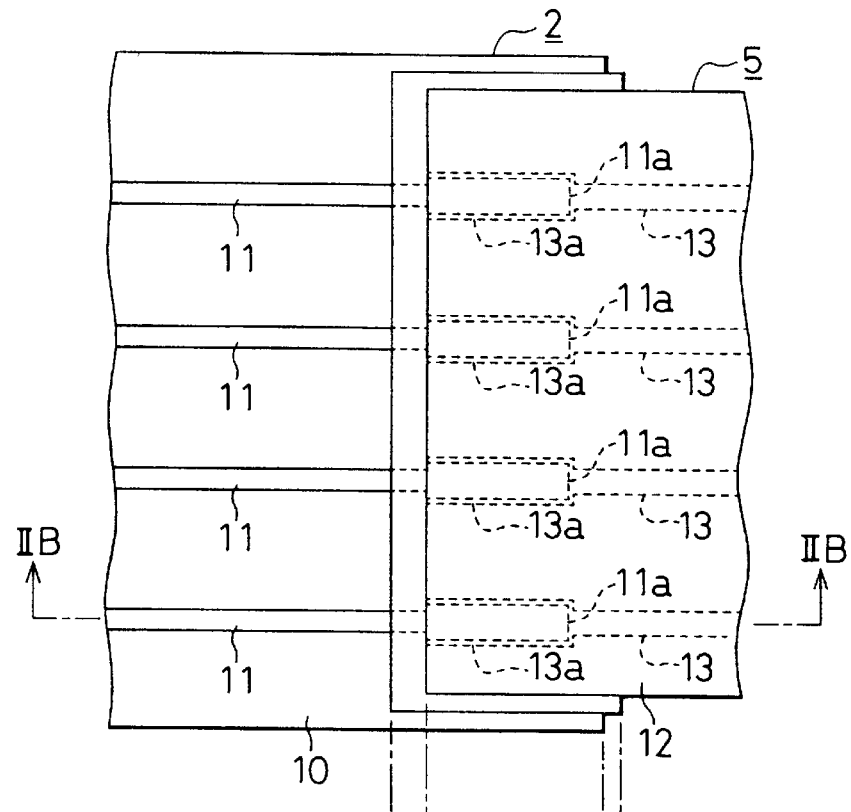
FIG. 2A is a plan view showing an interconnection portion of printed circuit boards in a first preferred embodiment.

FIG. 2A shows an enlarged plan view of the interconnection portion of the rigid printed circuit board 2 and the flexible printed circuit board 5. FIG. 2A shows a cross sectional view taken along line IIB—IIB in FIG. 2A.

Figure 2B:
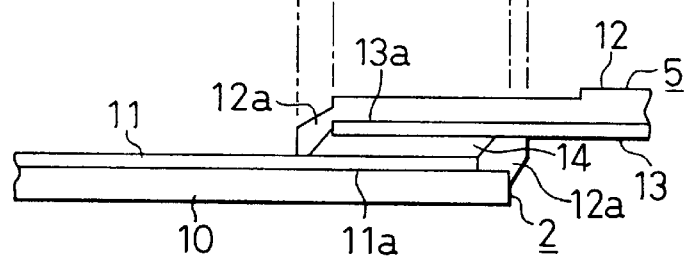
FIG. 2B is a cross-sectional view showing the interconnection portion, taken along line IIB—IIB in FIG. 2A.

Referring to FIGS. 2A and 2B, a plurality of conductive patterns 11 are formed on the upper surface of the glass epoxy substrate 10 of the rigid printed circuit board 2, and a plurality of lands (square lands) 11a are located on the edge portion of the substrate. A plurality of conductive patterns 13 are formed on the surface of the PEI film 12 provided to the flexible printed circuit board 5, and a plurality of lands (square lands) 13a are located on the edge portion of the substrate. The conductive patterns 11 and 13 are made of copper with a thickness of 18 µm.

Further, at the interconnection portion of the rigid printed circuit board 2 and the flexible printed circuit board 5, the lands 11a of the conductive pattern 11 are connected with the lands 13a of the conductive pattern 13 by solder 14, while the glass epoxy substrate 10 of the rigid printed circuit board 2 is adhered to the PEI film 12 of the flexible printed circuit board 5. Furthermore, the electrically interconnected portion provided by the lands 11a and 13a of the conductive patterns 11 and 13 is sealed with polyether imide (PEI) resin 12a extending from the PEI film 12 of the flexible printed circuit board 5.

Then, the method for connecting the flexible printed circuit board 5, i.e., a first printed circuit board, with the rigid printed circuit board 2, i.e., a second printed circuit board, is explained below with reference to FIGS. 3 to 5.

Figure 3:
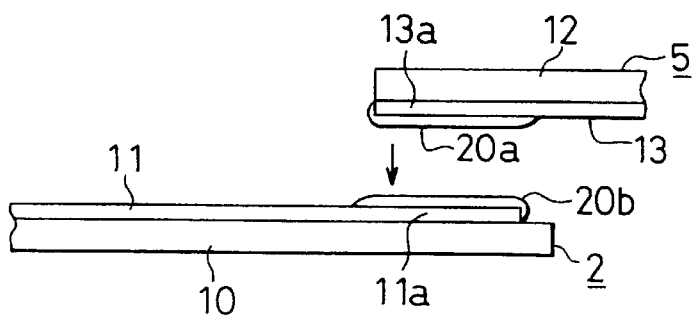
FIG. 3 is a cross-sectional view for explaining an interconnecting method of the printed circuit boards.

Referring to FIG. 3, the rigid printed circuit board 2 and the flexible printed circuit board 5 are prepared at first. The thickness of the PEI film 12 on the flexible printed circuit board 5 is in a range of approximately 25 to 100 µm. The conductive pattern 11 is formed on the glass epoxy substrate 10 of the rigid printed circuit board 2, while the conductive pattern 13 is formed on the PEI film 12 of the flexible printed circuit board 5.

Then, solder paste 20b is applied to the land 13a of the conductive pattern 13 on the flexible printed circuit board 5, and solder paste 20a is applied to the land 11a of the conductive pattern 11 on the rigid printed circuit board 2. Otherwise, solder plating may be formed or solder may be solder-coated on the land 13a. The present embodiment adopts tin-lead eutectic solder having a melting point of 183° C.

Figure 4A:
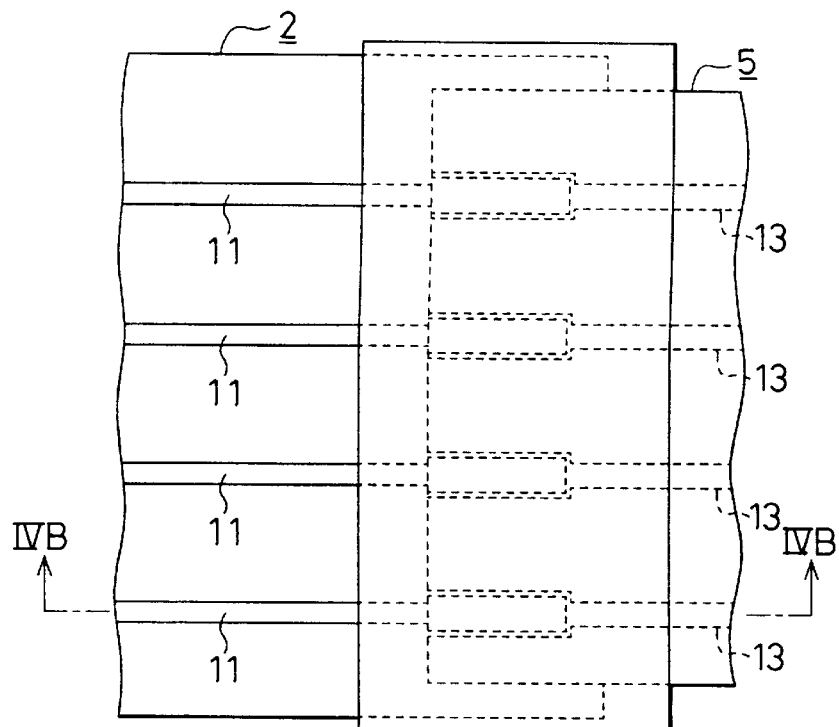
FIG. 4A is a plan view for explaining the interconnecting method.
Figure 4B:
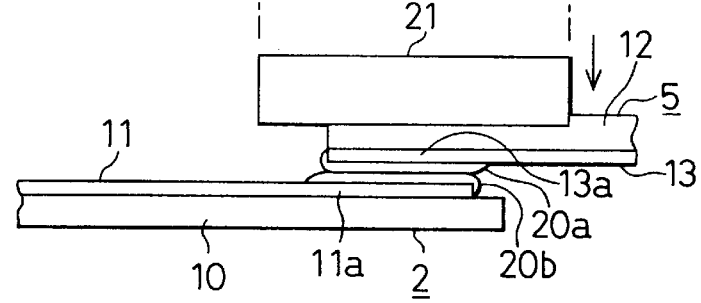
FIG. 4B is a cross-sectional view taken along line IVB—IVB in FIG. 4A.
Figure 5:
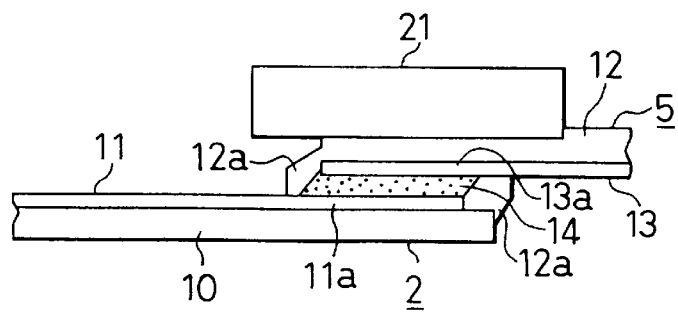
FIG. 5 is a cross-sectional view for explaining the interconnecting method.

Referring to FIGS. 4A and 4B, the flexible printed circuit board 5 is superposed on the rigid printed circuit board 2, and the lands 11a and 13a of the both conductive patterns 11 and 13 are located near to each other through the solder pastes 20a and 20b.

Further, a head 21 of a heating tool is placed on the land portion, and the temperature of the head 21 is elevated while pressing it downward. In this manner, the interconnection portion is heated to a temperature higher than 240° C., i.e., glass transition temperature Tg of polyether imide (PEI), while externally applying pressure thereto. In further detail, heating and pressurization are continued for 5 to 15 seconds at a temperature in a range of 240 to 300° C. The heating tool (heater head 21) used in the present embodiment is a pulse heating type.

Thus, this heating allows the solder to fuse to interconnect the lands 11a and 13a, while it provides simultaneously sealing of the lands 11a and 13a by making use of softening and deformation of the PEI film 12 (resin) provided to the flexible printed circuit board 5. More specifically, with reference to FIG. 5, each of the lands 11a of the rigid printed circuit board 2 is soldered to each of the lands 13a of the flexible printed circuit board 5 to establish an electric connection. Furthermore, a part of the PEI film 12 is deformed by the heater head 21 and supplied to the lands (electrical interconnection portion) 11a and 13a. As a result, the electrical interconnection portion is sealed by the PEI resin 12a.

As described above, unlike the conventional methods using an anisotropic conductive resin film or an anisotropic conductive resin membranes, the fusion of the substrate itself is utilized to conduct resin sealing simultaneously with the interconnection of the terminals, resulting in reduced cost. Further, since the softened PEI resin 12a of the PEI film 12 flows downward expelling air to seal the interconnecting potion, voids are less likely formed (voids tend to be less remained) as compared with the conventional case in which a film or the like is interposed between the surfaces. Accordingly, higher reliability is achieved.

In the electric interconnection between the rigid printed circuit board and the flexible printed circuit board according to the present embodiment, soldering of the terminals is performed simultaneously with the resin sealing in the vicinity of the terminals by softening the flexible printed circuit board making use of the thermoplastic characteristics thereof. However, it is noted that the interconnection of the first printed circuit board and the second printed circuit board can be implemented by using a fusible thermoplastic flexible printed circuit board resin in both or either of the printed circuit boards.

The printed circuit board on the lower side may be a printed circuit board using thermoplastic resin as the insulating substrate material similar to that of the upper printed circuit board. Furthermore, instead of the resin substrate, a ceramic substrate or a metal base substrate may be used for the lower printed circuit board.

In addition to PEI, polyether ether ketone (PEEK) or a resin containing both of them can be used for the thermoplastic resin (i.e., the base film of the flexible printed circuit board). Otherwise, polyethylene naphthalate (PEN) or polyethylene terephthalate (PET) may be used as the thermoplastic resin (i.e., the base film of the flexible printed circuit board). In short, any type of thermoplastic resin may be used so long as it contains at least one selected from PEI, PEEK, PEN, and PET.

Figure 6:
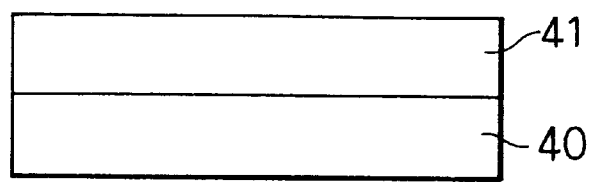
FIG. 6 is a cross-sectional view schematically showing a substrate as a modified example.

Otherwise, as an insulating substrate (base film) of the flexible printed circuit board, there can be used a structure as shown in FIG. 6, composed of a polyimide (PI) base 40 having thereon a laminate of a layer 41 made of at least one selected from PEI, PEEK, PEN, and PET. In the laminate above, for instance, the base 40 and the layer 41 may be adhered with each other by using an adhesive. Furthermore, since the polyimide base 40 has a thermal expansion coefficient of approximately 15 to 20 ppm, i.e., a value near to that of copper (17 to 20 ppm) frequently used as wiring, peeling off or warping and the like of the flexible printed circuit board can be prevented from occurring.

Further, the lands (terminals) of the both of the printed circuit boards can be joined together by using conductive adhesive, or may be joined by a solder plating film or conductive particles interposed therebetween. Otherwise, the lands can be directly brought into contact with each other.

Although square lands 11a and 13a were used in FIG. 2, the shape thereof is not only limited thereto, and there may be used round lands or differently shaped lands. As a modified example, for instance, referring to FIG. 3, the flexible printed circuit board can be constructed by applying the thermoplastic resin above mentioned from the upper side and the lower side, in such a manner that the conductive pattern 13, exclusive of the land 13a, is interposed therebetween. In this case, the interconnection between the rigid printed circuit board and the flexible printed circuit board is established by tightly adhering the lower thermoplastic resin to the front edge of the rigid printed circuit board. In this manner, the interconnection portion can be sealed more surely with the resin, and at the same time, the strength of the interconnection between the both printed circuit boards can be improved.

(Second Embodiment)

Figure 7A:
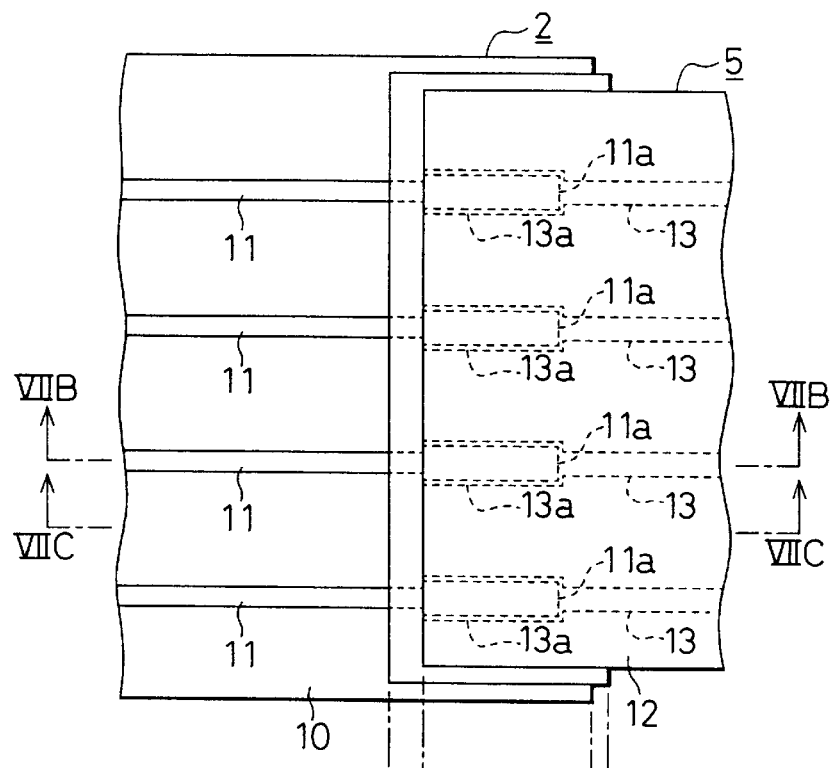
FIG. 7A is a plan view showing an interconnection portion of printed circuit boards in a second preferred embodiment.
Figure 7B:
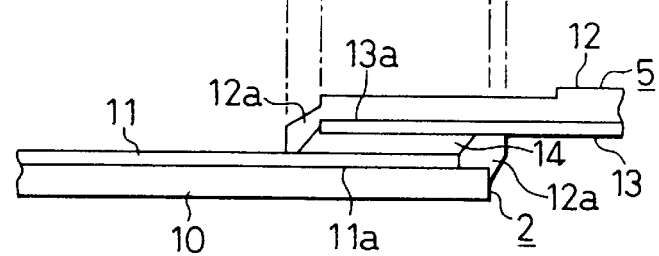
FIG. 7B is a cross-sectional view taken along line VIIB—VIIB in FIG. 7A.
Figure 7C:
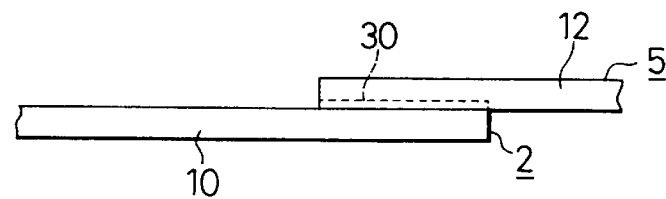
FIG. 7C is a cross-sectional view taken along line VIIC—VIIC in FIG. 7A.

With reference to FIGS. 7A to 7C, a second embodiment is described below by referring mainly on points differing from those of the first embodiment.

In the present embodiment, as specifically shown in FIG. 7C, in addition to the constitution of the first embodiment, an adhesion enhancing layer 30 is formed at the interface between the PEI film 12 and the glass epoxy substrate 10 at the adhering portion of the glass epoxy substrate 10 and the PEI film 12. A hydrocarbon compound is dispersed in the adhesion enhancing layer 30. Tetradecane ($C_{14}H_{30}$), alkane, is used as the hydrocarbon compound. The adhesion enhancing layer 30 has a thickness of approximately 20 to 100 $\mu$m. In this state, the PEI film 12 is tightly adhered to the glass epoxy substrate 10 because the peeling strength can be improved by incorporating alkane between the film and the substrate.

Then, the manufacturing method is described with reference to FIGS. 8A to 8C.

Figure 8A:
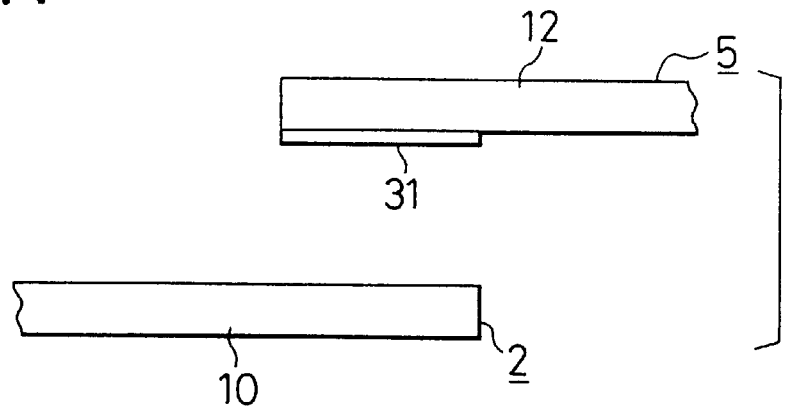
FIGS. 8A to 8C are cross-sectional views for explaining an interconnecting method of the printed circuit boards in the second embodiment.

Referring to FIG. 8A, the PEI film 12, which is a thermoplastic resin material, and the glass epoxy substrate 10 are prepared. A conductive pattern is formed on each of the PEI film 12 and the glass epoxy substrate 10. Then, a film 31 made of alkane (referred to hereinafter as "an alkane film"), more specifically, tetradecane ($C_{14}H_{30}$), is applied to the adhering portion of the PEI film 12. The boiling point of tetradecane ($C_{14}H_{30}$) is 250° C.

As the alkane, recommended is the use of alkane having a carbon number of 9 to 30. More specifically, there can be mentioned nonane ($C_9H_{20}$), decane ($C_{10}H_{22}$), undecane ($C_{11}H_{24}$), dodecane ($C_{12}H_{26}$), tridecane ($C_{13}H_{28}$), pentadecane ($C_{15}H_{32}$), hexadecane ($C_{16}H_{34}$), heptadecane ($C_{17}H_{36}$), octadecane ($C_{18}H_{38}$), nanodecane ($C_{19}H_{40}$), icosane ($C_{20}H_{42}$), henicosane ($C_{21}H_{46}$), docosane ($C_{22}H_{46}$), tricosane ($C_{23}H_{48}$), tetracosane ($C_{24}H_{50}$), pentacosane ($C_{25}H_{52}$), hexacosane ($C_{26}H_{54}$), heptacosane ($C_{27}H_{56}$), octacosane ($C_{28}H_{58}$), nanocosane ($C_{29}H_{60}$), and triacontane ($C_{30}H_{62}$).

Figure 8B:
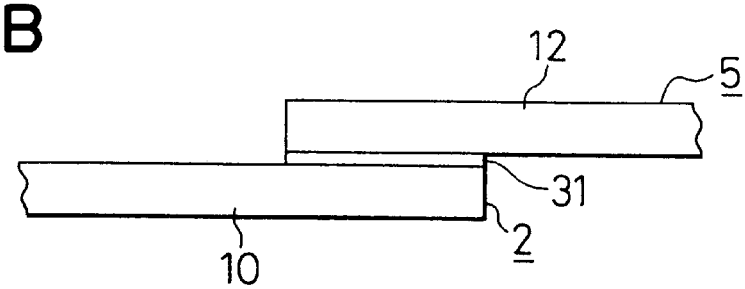

Then referring to FIG. 8B, the PEI film 12 is placed while incorporating the alkane film 31 on the glass epoxy substrate 10. Further in this state, the adhering portion is heated to 270° C., i.e., a temperature higher than 240° C. that is the glass transition temperature Tg of polyether imide (PEI). At the same time, pressure of 0.5 MPa is applied between the PEI film 12 and the glass epoxy substrate 10. The heating and pressurization are performed for 10 seconds.

Figure 8C:
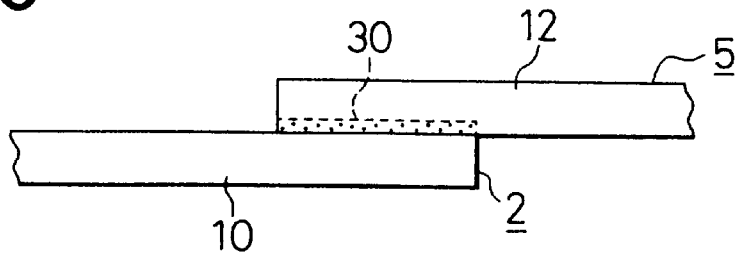

As a result, as shown in FIG. 8C, alkane of the alkane film 31 undergoes boiling while the PEI film 12 is softened and deformed. Thus, the adhesion enhancing layer 30 containing alkane dispersed therein is formed in a surface portion of the PET film 12 at the interface between the softened PEI film 12 and the glass epoxy substrate 10. The PEI film 12 is strongly adhered to the glass epoxy substrate 10. In this manner, the elastic modulus of the layer 30 containing alkane dispersed therein is low, and sufficient adhesion is established between the layer and the upper surface of the glass epoxy substrate 10.

Figure 9:
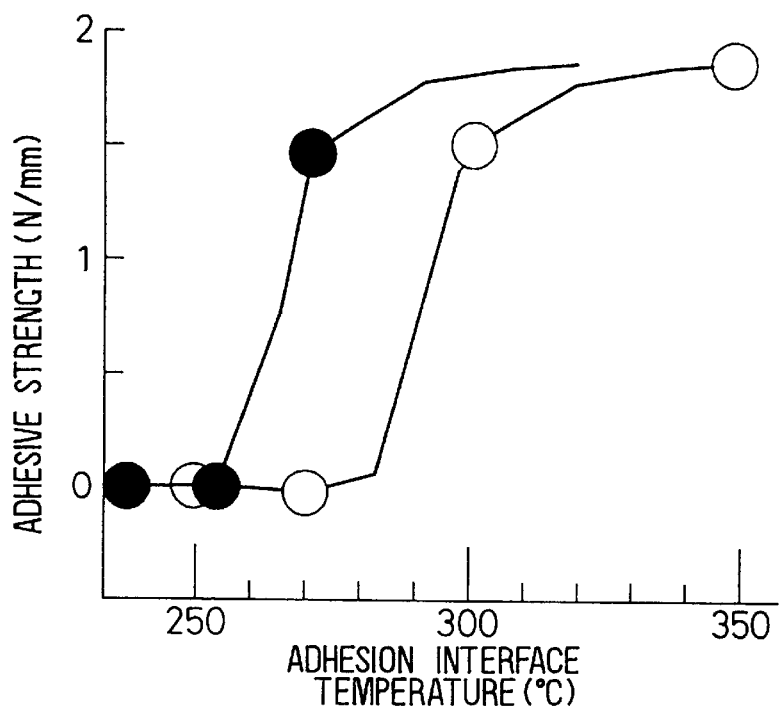
FIG. 9 is a graph showing experimentally obtained adhesive strengths in the second embodiment.

FIG. 9 shows measured results for adhesive strength with changing adhesion interface temperature. Samples using alkane film ($C_{14}H_{30}$) and not using alkane film are employed. In FIG. 9, the adhesive strengths of the sample using the alkane are plotted with ●, while the adhesive strengths of the sample not using alkane are plotted with ○.

Referring to FIG. 9, for instance, when the adhesion is performed at 270° C., the sample using the alkane film can provide adhesive strength of 1.5 N/mm. That is, if adhesive strength of 1.5 N/mm is to be achieved at the vertical axis, the sample not using alkane film requires heating to about 300° C., however, for the sample using the alkane film, heating to about 270° C. is sufficient. This result indicates that the use of the alkane film makes it possible to obtain the same adhesive strength by the heating of lower temperature.

In this manner, the PEI film 12 can be adhered with high adhesive strength by using the adhesion enhancing layer 30 containing alkane dispersed therein at the adhesion interface. As a result, a product having high adhesive strength and high reliability in insulation can be obtained. Furthermore, hydrocarbon compounds such as alkanes are hydrophobic, and therefore provide an excellent damp proof insulating property.

Figure 10A:
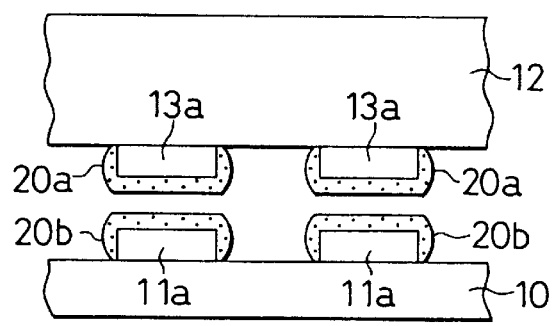
FIGS. 10A and 10B are cross-sectional views at land portions.
Figure 10B:
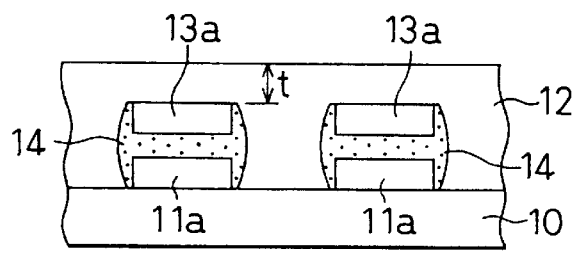

Moreover, since the use of the adhesion enhancing layer 30 above enables adhesion at lower temperatures, the loss of film thickness ascribed to an excessive loss of resin can be prevented. In further detail, by applying solder pastes 20a and 20b to the lands 11a and 13a as shown in FIG. 10A and heating them by using the heater head 21, bonding can be implemented by solder 14 as shown in FIG. 10B. However, if the solder pastes are heated to high temperatures by the heater head 21, the resin is brought to a state of excessive flowing, and it results in a film having an excessively reduced thickness t at the lands 11a and 13a, which may lead to lack of sealing. In the present embodiment, which is in contrast to the case above, alkane is incorporated to realize adhesion at lower temperatures. Thus, a sufficiently large film thickness t can be obtained by suppressing the flow of the resin.

In the present embodiment again, it is preferred that the thermoplastic resin material contains at least any one of polyether imide (PEI), polyether ether ketone (PEEK), polyethylene naphthalate (PEN), and polyethylene terephthalate (PET). In this case, the peeling strength can be improved by mixing polyether imide (PEI) with polyether ether ketone (PEEK). In the case of the present embodiment, as shown in FIG. 6, there can be used the laminate structure including the polyimide substrate 40 having laminated thereon the layer 41 made of at least one selected from PEEK, PEI, PEN, and PET.

Although alkane was used as the hydrocarbon compound above, there can also be used a substance having a branch (branches) of carbon bond, alkene having a carbon double bond in a skeleton of hydrocarbon, or alkyne having a carbon triple bond, or an aromatic or cyclic hydrocarbon having no functional groups. Furthermore, instead of hydrocarbon compounds, there can be used silicone oil and the like; there can be used any substance so long as it lowers the modulus of elasticity.

Instead of the glass epoxy substrate used as the base, there can also be used other thermoplastic resins or thermosetting resins as the resin materials, or a metallic material such as a copper foil and the like, as a material other than resins.

(Third Embodiment)

Figure 11:
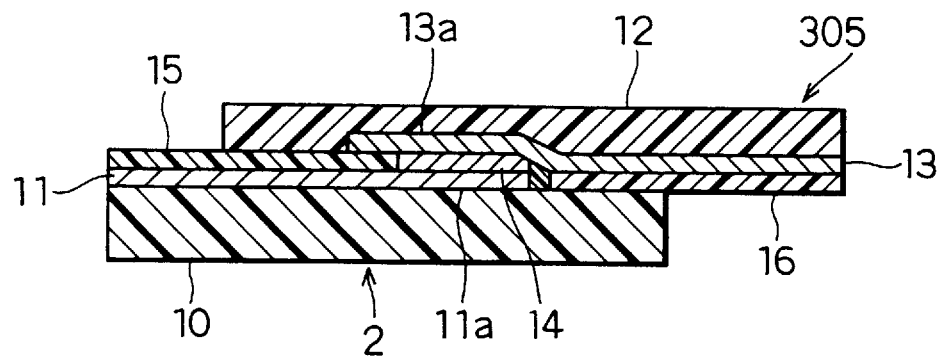
FIG. 11 is a cross-sectional view showing an interconnection portion of printed circuit boards in a third preferred embodiment.

With reference to FIGS. 11 to 13, a third embodiment is described below by referring mainly on points differing from the first embodiment.

In the present embodiment, an insulating substrate 12 of a flexible printed circuit board 305 is made of thermoplastic resin (@PEEK) containing 65 to 35% by weight of polyether ether ketone (PEEK) and 35 to 65% by weight of polyether imide (PEI). The @PEEK is thermoplastic resin which softens at a temperature not lower than the glass transition temperature, i.e., at a temperature approximately higher than the glass transition temperature.

FIG. 11 shows an enlarged view of the portion at which a rigid printed circuit board 2 is interconnected with the flexible printed circuit board 305. A plurality of conductive patterns 11 are formed on the upper surface of the rigid printed circuit board 2, and a plurality of lands 11a are respectively formed on the edge portion of the conductive patterns that are terminated at a position located at a predetermined distance from the edge portion of the board 2. Solder 14 is applied to the lands 11a as an interconnection material.

A plurality of conductive patterns 13 are formed on the surface of the flexible printed circuit board 305 in correspondence to the conductive patterns 11 provided on the rigid printed circuit board 2, and a plurality of lands 13a are formed as interconnection terminals at the edge portions of the patterns 13. The conductive patterns 11 and 13 are made of copper.

At the interconnection portion of the rigid printed circuit board 2 and the flexible printed circuit board 305, the lands 11a of the conductive patterns 11 are respectively connected with the lands 13a of the conductive patterns 13 by the solder 14. The glass epoxy resin (insulating substrate) 10 constituting the rigid printed circuit board 2 is adhered to the @PEEK (insulating substrate) 12 constituting the flexible printed circuit board 305 by the deformation of @PEEK 12 at the portions among the conductive patterns 11 and 13.

Furthermore, the glass epoxy resin 10 provided at the end portion of the rigid printed circuit board 2 is adhered to solder resist 16 formed in such a manner that it covers the conductive patterns 13 except for the portions of the land s13a on the flexible printed circuit board 305. @PEEK 12 provided to the end portion of the flexible printed circuit board 305 is adhered to solder resist 15 formed in such a manner that it covers the conductive patterns 11 except for the portions of the lands 11a on the rigid printed circuit board 2. Thus, the conductive portions, i.e., the conductive patterns 11 and 13, are resin sealed with @PEEK 12 of the flexible printed circuit board 305.

Figure 12A:
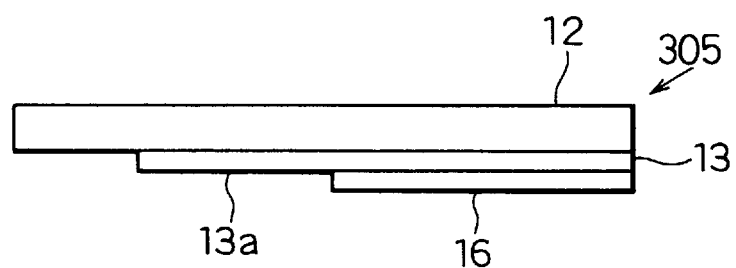
FIGS. 12A and 12B are a side view and a plan view showing a flexible printed circuit board in the third embodiment.
Figure 12B:
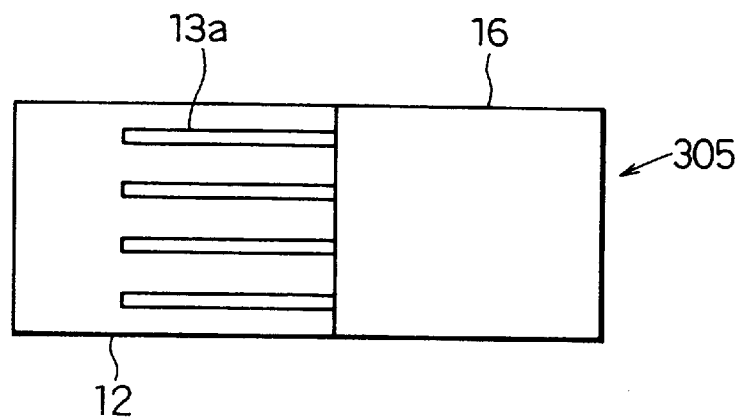

More specifically, with reference to FIGS. 12A and 12B, the conductive patterns 13 include a plurality of wiring members extending in parallel with the longitudinal direction of the flexible printed circuit board 305, and the end portions thereof function as the lands 13a of the interconnecting terminals. Except for the lands 13a, the conductive patterns 13 are covered with the solder resist 16 provided as a protective film.

Since the lands 13a of the conductive patterns 13 are formed at positions distant from the front edge portion of the connection surface of the printed circuit board 305, the front edge portion of the connection surface consists of only @PEEK 12. Furthermore, among the plurality of the wiring members, the wiring members located at the both ends are formed at positions set apart for a predetermined distance from the side edge surfaces of @PEEK 12. Accordingly, the wiring members can be surely sealed at the time @PEEK 12 is softened and deformed.

Next, the method for connecting the flexible printed circuit board 305, i.e., the first printed circuit board, with the rigid printed circuit board 2, i.e., the second printed circuit board, is explained below with reference to FIGS. 13A to 13C.

Figure 13A:
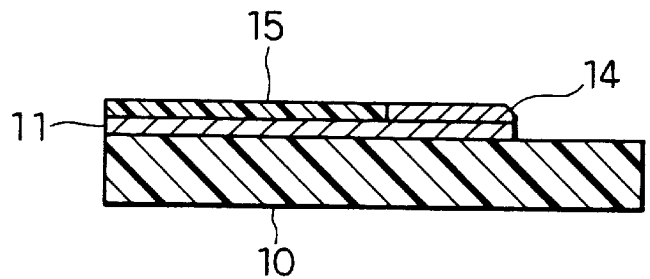
FIGS. 13A to 13C are cross-sectional views for explaining an interconnecting method in the third embodiment.

First, referring to FIG. 13A, the conductive patterns 11 are formed on the insulating substrate 10 of the rigid printed circuit board 2. At this point, the conductive patterns 11 are not formed on the front edge portion of the rigid printed circuit board 2. Accordingly, the glass epoxy resin insulating substrate 10 is exposed at the front edge portion of the rigid printed circuit board 2. Then, the solder resist 15 is formed to coat the conductive patterns 11, except the edge portion of the rigid printed circuit board 2, at which the conductive patterns 11 is not formed, the lands 11 of the conductive patterns and the portions defined between the lands 11. The lands 11a of the conductive patterns 11 are coated with paste-like solder 14. In this instance, the solder 14 may be formed on the lands 11a by solder plating or solder coating. In the present case, tin-lead eutectic solder is used as the solder 14, which has a melting point (temperature of fusion) of 183° C.

A flux or a hydrocarbon compound such as alkane is applied to the solder 14 to assure wettability of the solder 14. Particularly, in case of coating a hydrocarbon compound such as alkane, it is preferred that not only the solder 14, but also the superposed surfaces of the both substrates are coated therewith. In this manner, the adhesiveness of @PEEK 12 can be improved. More specifically, while interposing alkane between the rigid printed circuit board 2 and the flexible printed circuit board 305, they are heated to a temperature not lower than the boiling point of alkane. Thus, alkane intrudes into the surface of @PEEK 12, and as a result, a layer containing alkane dispersed therein is formed on the surface of @PEEK 12. The dispersion layer thus formed exhibits a modulus of elasticity lower than the initial modulus of elasticity possessed by @PEEK 12. That is, the adhesiveness of @PEEK 12 can be improved by forming the dispersion layer on the surface of @PEEK 12.

Figure 13B:
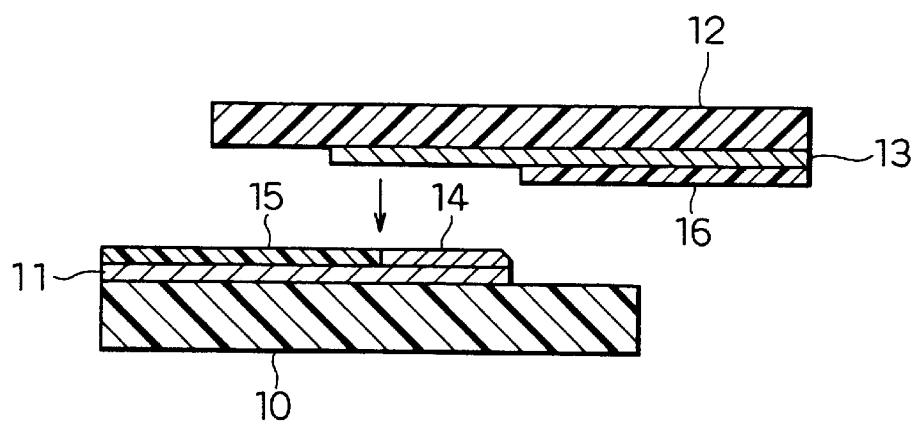

Then, as is shown in FIG. 13B, the conductive pattern 13 are formed on the flexible printed circuit board 305 in such a manner that they correspond to the conductive patterns 11 of the rigid printed circuit board 12. In this instance again, the conductive patterns 13 are not formed on the front edge portion of the connection surface of the flexible printed circuit board 305. Subsequently, the solder resist 16 is formed except for the front edge portion of the flexible printed circuit board 305, the lands 13a of the conductive patterns 13, and the portions between the lands 13. The flexible printed circuit board 305 thus formed is aligned and superposed to the rigid printed circuit board 2.

Figure 13C:
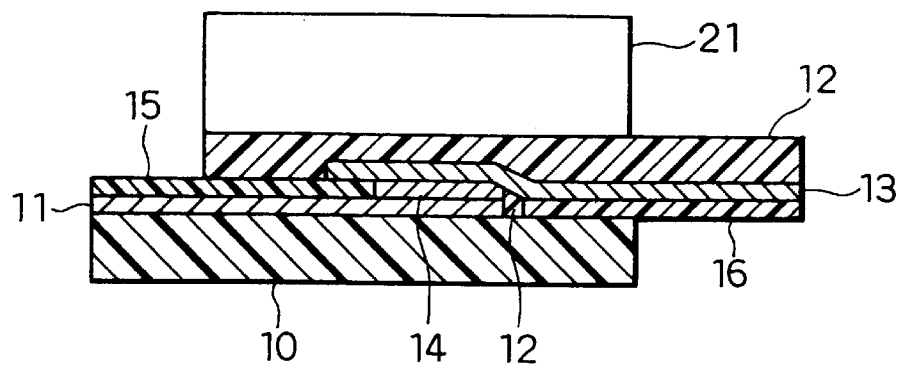

Then, referring to FIG. 13C, the interconnection portion, at which the rigid printed circuit board 2 and the flexible printed circuit board 305 are superposed, is heated while applying pressure by a thermo-compression bonding tool 21. The glass transition temperature of @PEEK 12 is in a range of 150 to 230° C. The thermo-compression bonding tool 21 applies pressure to the interconnection portion while controlling the temperature to fall in a range not lower than the temperature of fusion of the solder 14 and not lower than the glass transition temperature of @PEEK 12. For instance, heat temperature is in a range of 240 to 300° C., and the heating and pressurization is continued for 5 to 15 sec. The thermo-compression bonding tool 21 is a pulse heating type.

This heating fuses the solder 14 to interconnect the lands 11a and 13a provided to the conductive patterns 11 and 13, while softening and deforming @PEEK 12 constituting the insulating substrate of the flexible printed circuit board 305 to seal the lands 11a and 13a as well as the conductive patterns 11 and 13.

In the present embodiment, the conductive patterns 13 are not formed on the front edge portion of the flexible printed circuit board 305, and the portion consisting only of @PEEK 12 is formed. The front edge portion consisting of @PEEK 12 supplies sufficient amount of resin necessary to seal the conductive pattern 13.

Figure 19:
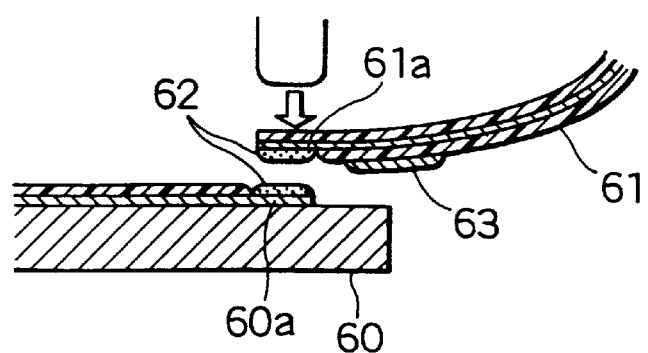
FIG. 19 is a cross-sectional view for explaining another prior art.

More specifically, as shown in FIG. 19, in a conventional flexible printed circuit board, since a conductive pattern is provided to an edge portion of a printed circuit board, the conductive pattern may be exposed at the front edge portion. Therefore, the circuit board adopts a constitution of separately forming a protective insulating film and the like.

On the other hand, the present embodiment adopts thermoplastic resin as the material for the insulating substrate of the flexible printed circuit board 305, and hence, the resin sealing of the interconnection portion is performed by utilizing the fluidity of the thermoplastic resin. In particular, because a portion consisting only of @PEEK 12 is provided to the front edge portion of the flexible printed circuit board 305, the exposure of the conductive pattern 13 can be prevented.

When heated to a temperature not lower than the glass transition temperature, @PEEK 12 constituting the insulating substrate of the flexible printed circuit board 305 undergoes softening and deformation while forming tight adhesion with the glass epoxy resin and the solder resist. Accordingly, adhesive used for interconnecting the rigid printed circuit board with the flexible printed circuit board can be omitted in the present embodiment.

As described above, the production cost can be reduced in accordance with the present embodiment, because the fusibility of the substrate itself is utilized to perform resin sealing at the same time of establishing interconnection between the terminals. Furthermore, when @PEEK 12 of the flexible printed circuit board 305 is softened, it flows to the direction of the rigid printed circuit board 2 while expelling the air that is present between the rigid printed circuit board 2 and the flexible printed circuit board 305. Accordingly, higher reliable interconnection is achieved because voids tend to be less formed as compared with the conventional case in which a film or the like is interposed between the substrates.

(Fourth Embodiment)

A fourth embodiment according to the present invention is described below with reference to FIGS. 14A, 14B, and 15.

A method of interconnection and an interconnection structure according to the fourth embodiment using a rigid printed circuit board 2 and a flexible printed circuit board 105 include the same portions as those described in the third embodiment. Therefore, detailed explanation for the same portions is omitted, and more emphasis is made to those portions differing from the third embodiment.

Figure 14A:
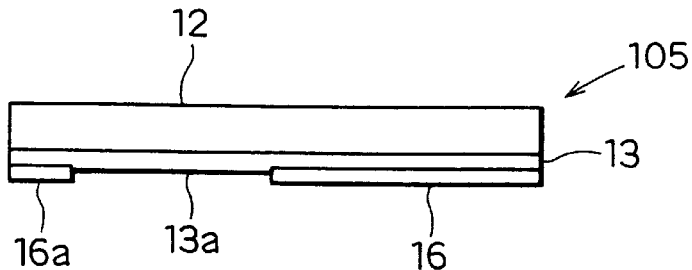
FIGS. 14A and 14B are a side view and a plan view showing a flexible printed circuit board in a fourth preferred embodiment.
Figure 14B:
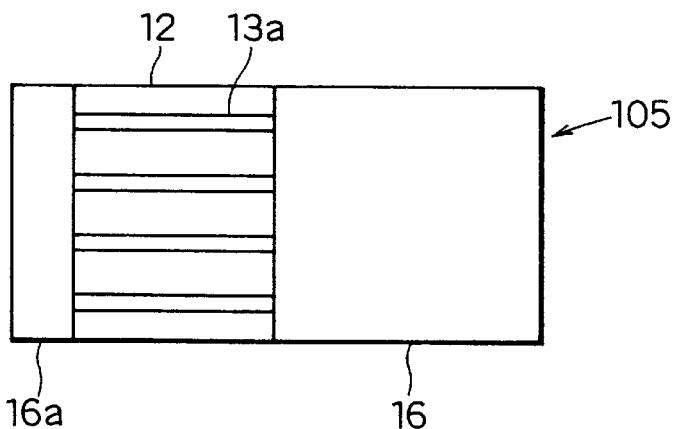
Figure 15:
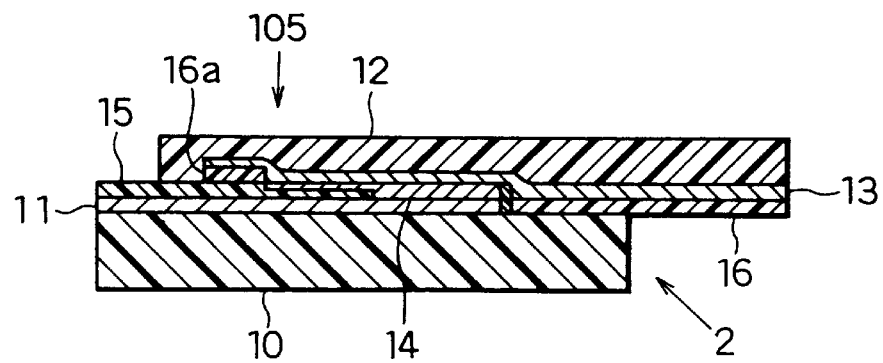
FIG. 15 is a cross-sectional view showing an interconnection portion in the fourth embodiment.

Referring to FIGS. 14A, 14B, and 15, the flexible printed circuit board 105 according to the fourth embodiment has a solder resist 16a placed on the front edge portion of the substrate. This is the point most differing from the flexible printed circuit board 305 described in the third embodiment.

When an excessive amount of solder 14 is provided on the lands 11a of the conductive patterns 11 formed on the rigid printed circuit board 2, if the superposed portion of the rigid printed circuit board 2 and the flexible printed circuit board 5 is pressed and heated by the thermo-compression bonding tool 21, there is a fear that the fused solder 14 flows along the conductive pattern 13 and runs out from the front edge of the flexible printed circuit board.

Accordingly, in the present embodiment with reference to FIGS. 14A and 14B, the solder resist 16a is provided on the front edge portion of the connection surface of the flexible printed circuit board 105. When the solder 14 is provided at an excessive amount to the lands 11a of the conductive patterns 11, the flow of the solder 14 is blocked at the front edge portion of the substrate by the solder resist 16a. Thus, as shown in FIG. 15, the running down of the solder 14 from the front edge portion of the flexible printed circuit board 105 is surely prevented from occurring in case the flexible printed circuit board 105 is joined with the rigid printed circuit board 2 by the thermo-compression bonding tool 21. In this manner, the insulating properties of the connecting portion can be assured.

Incidentally, as shown in FIG. 15, the thermoplastic resin constituting the insulating film 12 of the flexible printed circuit board 105 is deformed by heating to cover the solder resist 16a at the front edge portion thereof and to be adhered to the solder resist 15 of the rigid printed circuit board 2. Accordingly, the lands and the conductive patterns are sealed more securely.

In the embodiment shown in FIGS. 14A and 14B, the conductive patterns 13 made of copper extend to the front edge portion of the flexible printed circuit board 105, and the solder resist 16a is formed in such a manner that it covers the conductive patterns 13 at the front edge portion. However, the conductive patterns 13 need not be provided to the front edge portion of the substrate, but similar to the third embodiment, the conductive patterns 13 may be terminated before it reach the front edge portion. In such a case, the solder resist 16a is directly formed on @PEEK 12 forming the insulating substrate of the flexible printed circuit board 105. This is more preferred because the conductive patterns 13 are not exposed to the outside in case @PEEK 12 undergoes softening and deformation.

Furthermore, the solder resist can be formed not only on the front edge portion of the connection surface, but also to the both side edge portions that are in parallel with the longitudinal direction of the flexible printed circuit board 105. This makes it possible to prevent the solder from running out in any directions.

(Fifth Embodiment)

A fifth embodiment according to the present invention is described below with reference to 16A, 16B, and 17.

A method of interconnection and an interconnection structure according to the fifth embodiment using a rigid printed circuit board 2 and a flexible printed circuit board 205 also include the same portions as those described in the third embodiment. Accordingly, detailed explanation for the same portions is omitted, and more emphasis is made to those portions differing from the third embodiment.

Figure 16A:
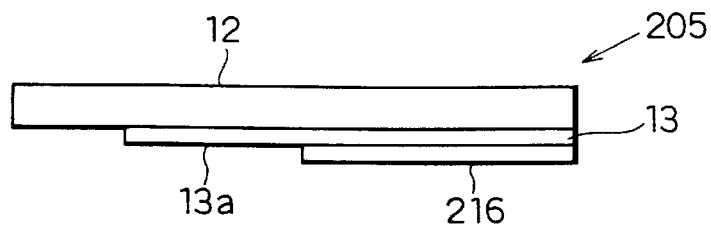
FIGS. 16A and 16B are a side view and a plan view showing a flexible printed circuit board in a fifth preferred embodiment.
Figure 16B:
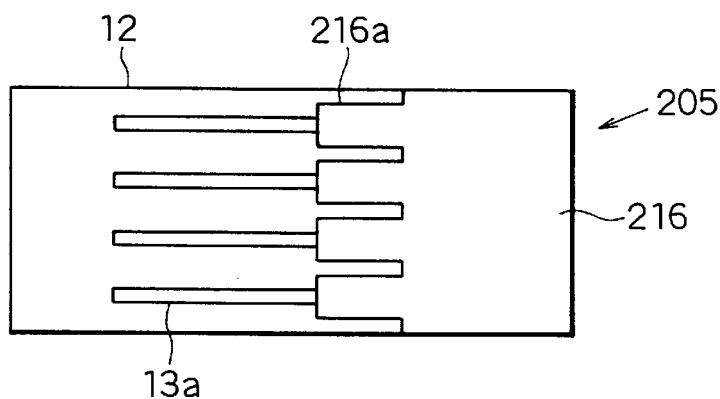

Referring to FIGS. 16A and 16B, the flexible printed circuit board 205 according to the fifth embodiment has solder resist 216 thereon, and the solder resist 216 has at an edge portion thereof a plurality of protruding portions 216a formed in accordance with the conductive patterns 13 in such a manner that @PEEK 12 located between the neighboring conductive patterns 13 should be exposed. This is the point most differing from the flexible printed circuit board 305 described in the third embodiment.

The solder resist 216 is constructed by, for instance, adding filler, organic solvent, setting agent, etc., to modified epoxy resin used as a principal component. If it is attempted to adhere the solder resist 216 with the glass epoxy resin provided as the insulating substrate 10 of the flexible printed circuit board 205 by pressing and heating, the adhesive strength results insufficient because the both possess thermosetting characteristics.

Accordingly, in the present embodiment, the solder resist provided between the neighboring conductive patterns 13 is removed to form irregularities on the end portion of the solder resist 216, such that the thermoplastic resin @PEEK 12 can be exposed at the indented portions.

Figure 17:
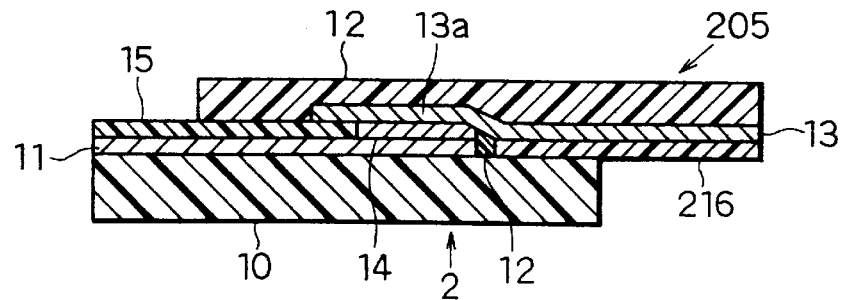
FIG. 17 is a cross-sectional view showing an interconnection portion in the fifth embodiment.
Figure 18:
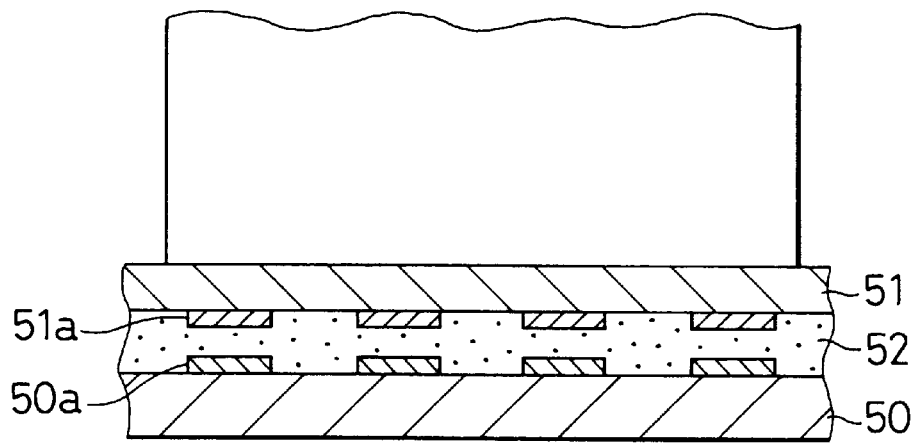
FIG. 18 is a cross-sectional view for explaining a prior art.

Referring to FIG. 17, a region in which no conductive pattern 11 nor a solder resist 15 is formed is provided at the front edge portion of the rigid printed circuit board 2 that is to be interconnected with the flexible printed circuit board 205. That is, before connecting with the flexible printed circuit board 205, the rigid printed circuit board 2 has the front edge region on which the material of the insulating substrate 10, i.e., the glass epoxy resin is exposed.

Then, as described above, @PEEK 12 exposed at the concave portions of the solder resist 216 is positioned with the glass epoxy resin 10 provided at the front edge portion of the rigid printed circuit board 2. More specifically, the front edge portions of the concave portions in the solder resist 216 at which @PEEK 12 is exposed are aligned in such a manner that they should be located in the interior of the edge surface of the rigid printed circuit board 2.

The thus exposed @PEEK 12 undergoes softening and deformation in case the joint portion is pressed and heated by the thermo-compression bonding tool 21, and flows toward the rigid printed circuit board 2. Then, the softened @PEEK 12 is tightly adhered to the glass epoxy resin 10 to establish tight bonding.

In this manner, the bonding strength of the heel side at the bonding portion of the flexible printed circuit board 205 can be improved. Furthermore, since @PEEK 12 reaches the surface of the rigid printed circuit board 2 and is tightly bonded to the glass epoxy resin 10 at the heel side of the bonding portion of the flexible printed circuit board 205, the conductive patterns 13 at the heel side of the bonding portion are surrounded by the glass epoxy resin 10 and @PEEK 12. Accordingly, the conductive patterns 13 on the heel side of the bonding portion can be completely sealed with resin.

In the electric interconnection between the rigid printed circuit board and the flexible printed circuit board according to the embodiments above, soldering of the terminals is performed simultaneously with the resin sealing in the vicinity of the terminals by softening the flexible printed circuit board making use of the thermoplastic characteristics thereof. However, it is noted that the interconnection of the first printed circuit board and the second printed circuit board can be implemented by using a thermoplastic flexible printed circuit board resin in both or either of the printed circuit boards. When using a rigid printed circuit board, a ceramic substrate, a metal-based substrate, or the like may be used for the insulating substrate of the rigid printed circuit board, in addition to the resin substrate.

In addition to @PEEK described above, polyether imide (PEI) or polyether ether ketone (PEEK) can be used solely for the insulating resin material of the flexible printed circuit board. Otherwise, polyethylene naphthalate (PEN) or polyethylene terephthalate (PET) may be used as the insulating resin material of the flexible printed circuit board.

As an insulating substrate of the flexible printed circuit board, there can be used a laminate structure composed of a polyimide substrate having thereon a layer made of at least one selected from PEEK, PEI, PEN, and PET. For instance, the layer made of thermoplastic resin material can be laminated with and adhered to the polyimide substrate by adhesive. Since the polyimide substrate has a thermal expansion coefficient of approximately 15 to 20 ppm, i.e., a value near to that of copper (17 to 20 ppm) frequently used as wiring, peeling off, warping and the like of the flexible printed circuit board can be prevented from occurring.

Further, in the embodiments above, the solder 14 is provided to the lands 11a of the conductive patterns 11 of the rigid printed circuit board 2, however, the solder 14 may be provided on the lands 13a of the conductive patterns 13. Otherwise, the solder may be applied to both lands 11a and 13a. Furthermore, the lands (terminals) of the both printed circuit boards can be joined by conductive adhesive, or the lands may be brought into direct contact with each other. In addition, the lands in the conductive patterns may be provided in any shape selected from square lands, circular lands, deformed lands, or the like.

In the embodiments described above, instead of using solder resists 16 or 16a for the flexible printed circuit boards, the conductive pattern 13 may be covered with a cover lay made of any of the thermoplastic materials described above. As described hereinbefore, the solder resist containing modified epoxy resin as a principal component thereof suffers insufficient bonding strength when bonded to the epoxy resin used as the substrate material of the rigid printed circuit board or the solder resist using the same composition as that of the substrate material.

However, by covering the conductive patterns 13 of the flexible printed circuit boards with any of the thermoplastic materials (i.e., @PEEK, PEEK, PEI, PEN, and PET) described above, the cover lay establishes tight bonding with the solder resist formed on the substrate or the epoxy resin used for the substrate material of the rigid printed circuit board. Thus, the bonding strength between the both printed circuit boards can be greatly improved. Furthermore, because the cover lay is tightly adhered to the epoxy resin provided at the front edge portion of the rigid printed circuit board, the resin sealing of the electric interconnection portions of the both printed circuit boards can be more surely implemented.

Furthermore, it is possible to apply the aforementioned cover lay of a thermoplastic resin to the solder resist 15 that is formed on the conductive patterns 11 provided on the rigid printed circuit board.

While the invention has been described in detail by making reference to specific examples, it should be understood that various changes and modifications can be made without departing from the scope and the spirit of the present invention.

What is claimed is:

1. A method for interconnecting printed circuit boards, comprising:
    preparing a first printed circuit board having an insulating substrate made of a thermoplastic resin and having a conductive pattern with a land, and a second printed circuit board having a conductive pattern with a land;
    overlapping the land of the first printed circuit board with the land of the second printed circuit board to form an interconnection portion of the first printed circuit board and the second printed circuit board;
    heating the interconnection portion to a temperature approximately higher than a glass transition temperature of the thermoplastic resin while applying a pressure to the interconnection portion to electrically interconnect the land of the first printed circuit board with the land of the second printed circuit board; and
    softening and deforming a part of the thermoplastic resin forming the insulating substrate of the first printed circuit board to cover and seal the electrical interconnection portion.

2. The method of claim 1, wherein the preparing of a first printed circuit board having an insulating substrate made of a thermoplastic resin further includes preparing the first printed circuit board to have the insulating substrate made of the thermoplastic resin contain at least one selected from a group consisting of polyether imide, polyether ether ketone, polyethylene naphthalate and polyethylene terephthalate.

3. The method of claim 2, wherein the preparing of a first printed circuit board having an insulating substrate made of a thermoplastic resin further includes preparing the first printed circuit board to have the insulating substrate composed of a base member made of polyimide and a layer provided on the base member and containing at least one selected from a group consisting of polyether imide, polyether ether ketone, polyethylene naphthalate, and polyethylene terephthalate.

4. The method of claim 1, further comprising:
    overlapping the insulating substrate of the first printed circuit board with an insulating substrate of the second printed circuit board to interpose a film therebetween that includes a material which can reduce a modulus of elasticity of the insulating substrate of the first printed circuit board;
    heating the interconnection portion to form an adhesion enhancing layer having a modulus of elasticity smaller than that of the insulating substrate of the first printed circuit board in which the material is dispersed at a surface portion of the insulating substrate of the first printed circuit board, and to adhere the insulating substrate of the first printed circuit board with the insulating substrate of the second printed circuit board with the adhesion enhancing layer interposed therebetween.

5. The method of claim 4, wherein the overlapping of the insulating substrate of the first printed circuit board with an insulating substrate of the second printed circuit board to interpose a film therebetween that includes a material which can reduce a modulus of elasticity of the insulating substrate of the first printed circuit board further comprises overlapping the insulating substrate of the first printed circuit board with the insulating substrate of the second printed circuit board to interpose the film therebetween that includes a hydrocarbon compound.

6. The method of claim 5, wherein the overlapping of the insulating substrate of the first printed circuit board with the insulating substrate of the second printed circuit board to interpose the film therebetween that includes a hydrocarbon compound further comprises overlapping the insulating substrate of the first printed circuit board with the insulating substrate of the second printed circuit board to inter pose the film therebetween that includes a hydrocarbon compound that is one of an alkane, an alkene and an alkyne.

7. The method of claim 1, wherein:
    preparing the first printed circuit board and the second printed circuit board includes forming the conductive pattern on a region of a connection surface of the first printed circuit board, the region excluding a front edge portion of the first printed circuit board; and
    heating the interconnection portion softens and deforms the thermoplastic resin to seal the interconnection portion with the thermoplastic resin.

8. The method of claim 7, wherein preparing the first printed circuit board and the second printed circuit board includes:
    forming a first protective film on the conductive pattern of the first printed circuit board except the land; and
    forming a second protective film on the conductive pattern of the second printed circuit board except the land.

9. The method of claim 8, further comprising:
    adhering the front edge portion of the connection surface of the first printed circuit board to the second protective film on the second printed circuit board.

10. The method of claim 8, wherein:
the conductive pattern of the second printed circuit board is disposed on a region of a connection surface of the second printed circuit board, the region excluding a front edge portion of the second printed circuit board; and
the front edge portion of the second printed circuit board is adhered to the first protective film of the first printed circuit board.

11. The method of claim 8, wherein the forming of a first protective film on the conductive pattern of the first printed circuit board except the land further comprises forming the first protective film from a thermoplastic resin.

12. The method of claim 7, wherein the preparing of a first printed circuit board having an insulating substrate made of a thermoplastic resin and having a conductive pattern with a land, and a second printed circuit board having a conductive pattern with a land further comprises preparing the conductive pattern of the first printed circuit board and the conductive pattern of the second printed circuit board to have a plurality of wiring members and a plurality of lands respectively connected to the plurality of wiring members.

13. The method of claim 1, wherein the heating of the interconnection portion further comprises pulse heating the interconnection portion.

14. The method of claim 1, wherein the overlapping of the land of the first printed circuit board with the land of the second printed circuit board through a bonding material further comprises overlapping the land of the first printed circuit board with the land of the second printed circuit board through a solder plating film or conductive adhesive.

15. A method for interconnecting printed circuit boards, comprising:
forming a first board conductive pattern including a land on a first board connection surface of a first printed circuit board that is composed of an insulating substrate made of a thermoplastic resin;
forming a first board protective film on the first printed circuit board to cover the first board conductive pattern except the land, and to cover an edge area of the first board connection surface;
forming a second board conductive pattern including a land on a second board connection surface of a second printed circuit board;
overlapping the land of the first printed circuit board with the land of the second printed circuit board through a bonding material to form an interconnection portion between the first printed circuit board and the second printed circuit board;
heating the interconnection portion to a temperature approximately higher than a glass transition temperature of the thermoplastic resin while applying a pressure to the interconnection portion to electrically interconnect the land of the first printed circuit board and the land of the second printed circuit board through the bonding material,
wherein the forming of the first board protective film on the first printed circuit board to cover the edge area of the first board connection surface impedes the bonding material from flowing toward an outside of the first board connection surface; and
softening and deforming the thermoplastic resin constituting the insulating substrate of the first printed circuit board to cover and seal the interconnection portion.

16. The method of claim 15, further comprising deforming the thermoplastic resin to cover the first board protective film covering the edge portion of the first board connection surface.

17. The method of claim 15, further comprising forming a second board protective film to cover the second board conductive pattern except the land.

18. The method of claim 17, further comprising deforming the thermoplastic resin to cover the first board protective film disposed at the edge portion of the first board connection surface, and to adhere the thermoplastic resin to the second board protective film on the second printed circuit board.

19. The method of claim 15, wherein:
the second board conductive pattern is formed on a region of the second board connection surface, the region excluding a front edge area of the second printed circuit board; and
the first board protective film of the first printed circuit board is adhered to the front edge area of the second printed circuit board.

20. The method of claim 15, wherein the first board protective film is made of a thermoplastic resin material.

21. The method of claim 15, wherein each of the first board conductive pattern and the second board conductive pattern includes a plurality of wiring members and a plurality of lands respectively connected to the plurality of wiring members.

22. The method of claim 15, wherein the heating of the interconnection portion further comprises pulse heating the interconnection portion.

23. The method of claim 15, wherein the overlapping of the land of the first printed circuit board with the land of the second printed circuit board through a bonding material further comprises overlapping the land of the first printed circuit board with the land of the second printed circuit board through a conductive adhesive or solder plating film.

24. A method for interconnecting printed circuit boards, comprising:
forming a first board conductive pattern including a land on a first board connection surface of a first printed circuit board that is composed of an insulating substrate made of a thermoplastic resin;
forming a first board protective film on the first printed circuit board to cover the first board conductive pattern except the land, the first board protective film having a protective film protruding end portion covering the first board conductive pattern to expose the first board connection surface at both sides thereof;
forming a second board conductive pattern with a land on a second board connection surface of a second printed circuit board, the second board conductive pattern being terminated at a position located at a predetermined distance from a front edge portion of the second printed circuit board;
overlapping the land of the first printed circuit board with the land of the second printed circuit board so that the first board connection surface exposed at the both sides of the protective film protruding end portion faces the second board connection surface of the front edge portion of the second printed circuit board;
heating an interconnection portion between the first and second printed circuit boards to a temperature approximately higher than a glass transition temperature of the thermoplastic resin while applying a pressure to the interconnection portion to electrically interconnect the land of the first printed circuit board with the land of the second printed circuit board; and
softening and deforming a part of the thermoplastic resin forming the insulating substrate of the first printed circuit board to cover and seal the electrical interconnection portion.

25. The method of claim 24, wherein:

the forming of a first board conductive pattern further comprises forming the first board conductive pattern on a region of the first board connection surface, the region excluding a front edge portion of the first printed circuit board so that the thermoplastic resin is exposed at the front edge portion; and the heating of an interconnection portion between the first and second printed circuit boards further comprises adhering the thermoplastic resin exposed at the front edge portion to the second board connection surface.

26. The method of claim 24, further comprising, after forming the second board conductive pattern, forming a second board protective film on the second printed circuit board to cover the second board conductive pattern except the land.

27. The method of claim 24, wherein the forming of the first board conductive pattern and the second board conductive pattern further includes forming the first board conductive pattern and the second conductive pattern to include a plurality of wiring members and a plurality of lands respectively connected to the plurality of wiring members.

28. The method of claim 24, wherein the heating of the interconnection portion further comprises pulse heating the interconnection portion.

29. The method of claim 24, wherein the overlapping the land of the first printed circuit board with the land of the second printed circuit board further comprises applying a conductive adhesive or solder plating film between the land of the first printed circuit board and the land of the second printed circuit board.

* * * * *